United States Patent [19]

Schröter

[11] 3,984,856
[45] Oct. 5, 1976

[54] PROCESS AND APPARATUS FOR DEVELOPING DIAZOTYPE MATERIAL
[75] Inventor: Herbert Schröter, Taunusstein, Germany
[73] Assignee: Hoechst Aktiengesellschaft, Germany
[22] Filed: Oct. 11, 1974
[21] Appl. No.: 514,193

Related U.S. Application Data
[63] Continuation of Ser. No. 382,914, July 26, 1973, abandoned.

[30] Foreign Application Priority Data
July 29, 1972  Germany............................ 2237438

[52] U.S. Cl. .............................................. 354/300
[51] Int. Cl.² ........................................... G03D 7/00
[58] Field of Search ........... 354/297, 300, 319, 339; 355/3 DD

[56] References Cited
UNITED STATES PATENTS

| | | | |
|---|---|---|---|
| 2,228,562 | 1/1941 | Dieterle | 354/300 X |
| 2,257,207 | 9/1941 | Von Meister et al. | 354/300 X |
| 2,431,041 | 11/1947 | Hassler | 354/300 |
| 2,918,858 | 12/1959 | Dieterle | 354/300 |
| 3,472,143 | 10/1969 | Hixon et al. | 354/298 |
| 3,472,657 | 10/1969 | Mayer et al. | 355/3 DD X |
| 3,538,837 | 11/1970 | Moraw | 354/300 X |

FOREIGN PATENTS OR APPLICATIONS
309,784   4/1969   Sweden ........................... 355/3 DD

*Primary Examiner*—Fred L. Braun
*Attorney, Agent, or Firm*—James E. Bryan

[57] ABSTRACT

An apparatus for the continuous development of a diazotype material with a developer powder in which the developer powder is disposed in a hollow body, such as a rotatable drum, a fine-meshed network having openings smaller in cross-section than the cross-section of the smallest grains of the powder, such as a metal screen, forms at least a part of the walls of the hollow body and a transport device, such as an endless belt, moves the diazotype material relative to and in contact with the side of the network opposite the developer powder. Optionally a heating device may be disposed in the hollow body, a heating device may be disposed adjacent the hollow body to heat the diazotype material after it passes the hollow body, and a replenishing device, such as a hollow porous bar, may be disposed in the hollow body with a scanning device adjacent the diazotype material and operatively connected thereto to supply developer medium to the replenishing device in accordance with the area of the diazotype material to be developed.

1 Claim, 1 Drawing Figure

U.S. Patent    Oct. 5, 1976    3,984,856
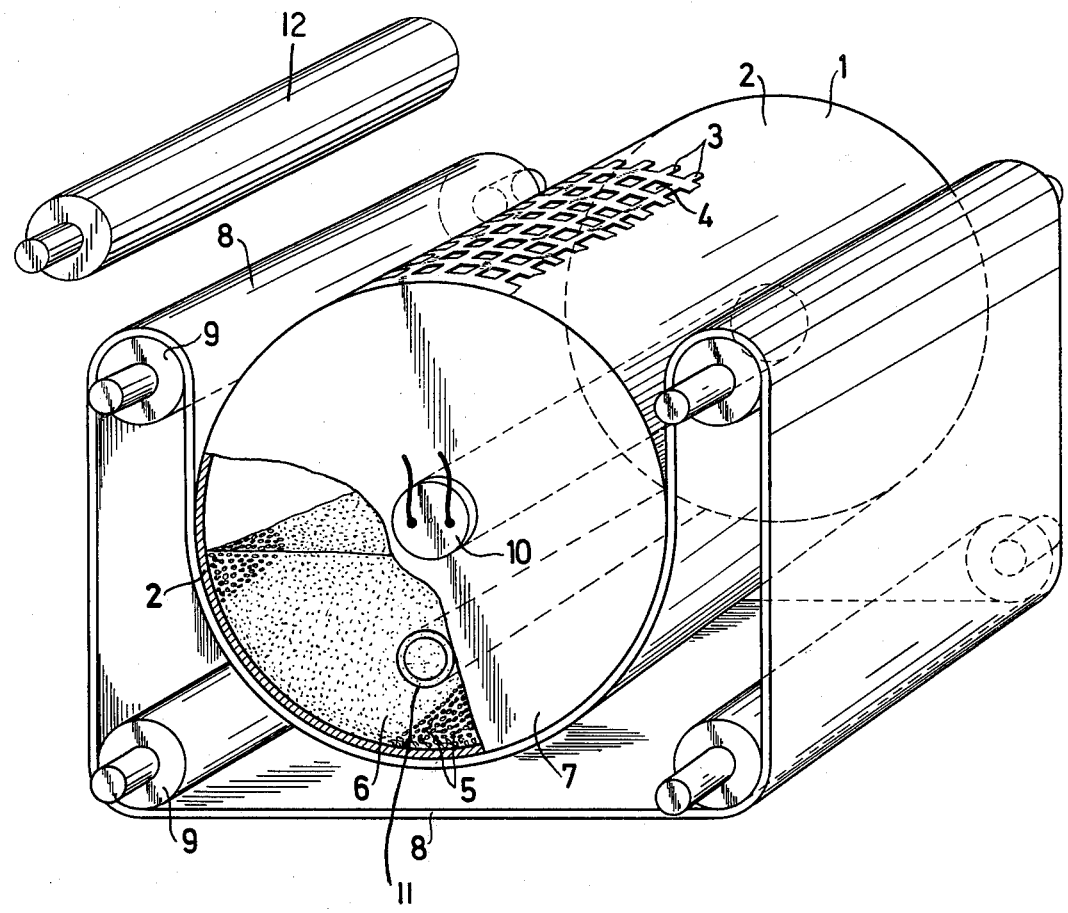

PROCESS AND APPARATUS FOR DEVELOPING DIAZOTYPE MATERIAL

This is a continuation of application Ser. No. 382,914, filed July 26, 1973, now abandoned.

The present invention relates to a process for the continuous development of diazotype material with a developer powder and to an apparatus for the performance of this process. The process and the apparatus are particularly suitable for developing binary light-sensitive diazotype papers with powders as described in German Offenlegungsschrift No. 2,126,160.

German Offenlegungsschrift No. 2,126,160 describes various types of apparatus for developing diazotype materials with powders. In one apparatus, the material to be developed is passed through a tank filled with developer powder. A disadvantage of that apparatus is that the transport of the material to be developed through the tank tends to create problems, since the material frequently is immersed and therefore creased. In another device described in Offenlegungsschrift No. 2,126,160, the material to be developed is passed between a bar magnet, on which the pulverulent magnetic developer substance adheres, and a pressure roller. In this device, the material to be developed does not come into contact with the developer powder for a sufficiently long period of time to ensure good developing. Finally, Offenlegungsschrift No. 2,126,160 describes a third type of apparatus in which the developer powder trickles over the diazotype material positioned at an angle. In these three devices, the diazotype material comes into direct contact with the developer powder during development, while the work is being carried out at temperatures above room temperature in order to achieve better and more rapid development. By direct contact and heating, developer powder adheres to the slightly tacky diazotype material, which, subsequently, has to be removed by brushing. However, the brushes clean the diazotype material satisfactorily only so long as they have not yet become contaminated by developer powder. The three types of apparatus thus have the disadvantage that, as soon as developer powder is present in the brushes, sufficient cleaning of the diazotype material of adherent developer powder is not possible.

There is accordingly a need for a process and an apparatus which ensure sufficient development without the diazotype material being contaminated by adherent developer powder after development. Furthermore, transport of the diazotype material during development should be trouble free.

The present invention provides a process for the continuous development of diazotype material with a developer powder, in which the diazotype material is moved along and in direct contact with a fine-meshed network which separates the diazotype material from the developer powder.

The present invention further provides an apparatus for the performance of this process, wherein the developer powder is disposed in a hollow body having at least a part of its surface formed as a fine-meshed network, the individual openings of which are smaller than the smallest cross-sectional area of the individual grains of the developer powder, and the diazotype material is passed along the network and in surface contact with the same by a transport means.

By the process and apparatus of the present invention, direct contact of diazotype material and developer powder is prevented, which would lead to the tacky adherence of developer powder to the diazotype material and thus to its contamination.

In the process of the invention, the diazotype material is separated from the developer powder by a fine-meshed network. The diazotype material is passed along that network and in direct contact with it. For accelerating development, the developer powder may be heated. Preferably, provision is made, by suitable measures, to always maintain fresh portions of the developer powder on the network.

The apparatus for the performance of the process contains a hollow body in which the developer powder is disposed. The hollow body must have a surface which permits surface contact between the hollow body and the diazotype material. In a simple device, the hollow body may be a box, for example, the bottom of which is covered with a network. A transport means passes the diazotype material along that network and simultaneously presses the diazotype material against the network so that there is direct contact between the diazotype material and the network. It is also possible to use a hollow body in which the network is an endless belt running over two or more rollers arranged parallel to one another. The transport means for the diazotype material may in this embodiment be an endless belt arranged parallel thereto. In a preferred embodiment, the hollow body is a drum whose wall consists of the network and the transport means is an endless belt which runs over a part of the periphery of the drum.

The network may be a fine-meshed wire net or a net of another suitable material, such as Perlon or Nylon. The area of the individual openings of the network must be smaller than the smallest cross-sectional area of the individual grains of the developer powder so that the developer powder does not fall out of the hollow body. The surface of the hollow body preferably has a network only on those parts along which the diazotype material is passed. The transport means, which passes the diazotype material along the network, may consist of several transport belts arranged parallel to one another. The transport means may also be a plurality of rollers positioned on axes arranged parallel to one another. Preferably, however, the transport means consists of a transport belt which has the same width as the network in order to achieve uniform pressure along the entire width of the diazotype material to be developed.

In order to always maintain fresh portions of the developer powder on the network, agitators may be arranged in the hollow body. In the preferred embodiment, in which the hollow body is a drum, this may be achieved simply by the rotation of the drum. Such rotation simultaneously fosters the transport of the diazotype material along the network.

For heating the developer powder, heating elements may be arranged in the hollow body. In development with powders consisting of a fine-granular carrier and amines adsorbed thereon, vigorous post-development takes place, i.e. the developed diazotype material reaches its final coloration in a period of 2 to 10 minutes after it has left the development zone. The operator is thus not able to judge, immediately on delivery of the diazotype material whether the running speed has been adjusted properly. It is thus advantageous to accelerate post-development to such an extent that the operator can see the final coloration immediately on delivery of the diazotype material so as to be able to make corresponding corrections in the adjustment of the machine. For this reason, a heating roller is arranged behind the hollow body, over which the diazotype material is run after having passed the network. This heating considerably accelerates post-development.

Since the developer medium, e.g. amine, adsorbed on the carrier, is used up, a device for replenishing the supply of developer medium is preferably employed in the interior of the hollow body. For example, this replenishing or proportioning device may be a hollow bar of porous material. Developer medium is fed into the interior of the hollow bar from which it penetrates, in uniform and small quantities, through the pores to the surface of the bar and there comes into contact with the body of developer powder continuously moving past the surface of the bar and is taken by the same. The feeding or replenishment of the developer medium into the interior of the hollow bar may be controlled by a scanning device in the path of the diazotype material to be developed which depends upon the scanned area of the diazotype material. Apparatus for processing wide copies require wide networks. In the case of such networks, support elements are preferably arranged in the interior of the hollow body. Care must be taken in the mounting of the support elements so that they do not cover the same areas of the diazotype material during development and thus cause stripes during development. In the case of stationary hollow bodies, the support elements are so arranged that they are not parallel to the direction of travel but form an angle with respect to the direction of travel. In the case of rotating hollow bodies, the same areas of the diazotype material are always covered by the support elements when the hollow body and the transporting means are moved at the same speed, irrespective of the orientation of the support elements. Therefore, it is advantageous in such apparatus to provide a second transport means and a second hollow body which are passed by the diazotype material after passing the first hollow cylinder, and the support elements of the second hollow body are staggered with respect to the first hollow body.

If the hollow body is rotated at a speed other than that of the transport means and if the diazotype material adheres more readily to the transport means than to the hollow body, stripes during development are prevented if the support elements are arranged spirally.

The invention shall now be further illustrated by way of an exemplary embodiment and of the drawing.

The DRAWING shows a section through a developing apparatus, the housing and the feed and delivery roller pairs for the diazotype material not being shown but only the actual developing zone into which the diazotype material coming from the exposure zone is transported.

The developing apparatus contains the drum 1 and the cover 2, which consists of a network 3 which is shown only partially and considerably enlarged for illustrative purposes. The area of the individual openings 4 of network 3 are smaller than the smallest cross-sectional area of the individual grains 5 of the body of developer powder 6 so that developer powder cannot fall out of the interior of the drum 1. The ends 7 of the drum 1 are closed.

In the drawing, the one end 7 is partially cut away to show the body of developer powder 6 contained in the drum 1. Around part of the drum periphery there runs an endless belt 8 which is guided over rollers 9. In the interior of the drum 1, is a heating bar 10 for heating the developer powder 6.

The diazotype material to be developed passes between the belt 8 and the drum 1 and is moved by the belt 8 in direct contact with the network 3. The developer medium adsorbed on the powder 6 acts upon the diazotype material through the openings 4 of the network. By this action, good development is achieved and the above-mentioned disadvantages occurring in the case of direct contact between the grains 5 of the body of developer powder 6 and the diazotype material is prevented. The drum 1 and the belt 8 may be moved at the same speed in this exemplary embodiment, in which no support elements for the network 3 are arranged in the interior of the drum 1. By the rotation of the drum 1, fresh portions of the developer powder 6 are always passed to the network 3 and simultaneously the transport of the diazotype material is aided.

If the drum 1 is so wide that holding elements are necessary these are preferably arranged spirally. The drum 1 is rotated at a speed somewhat slower or faster than that of the belt 8, the material used for the belt 8 having a better adhesion to the diazotype material than has the network 3 to the diazotype material. The diazotype material is then moved at the speed of the belt 8 through the developing zone. Thus, the same areas of the diazotype material come into contact with continuously changing parts of the network 3.

The drawing also shows a hollow bar 11 of porous material which is employed for replenishing the developer medium. Also shown in the drawing is a heating roller 12, positioned behind the drum 1, over which the diazotype material is run after having passed the network 3.

It will be obvious to those skilled in the art that many modifications may be made within the scope of the present invention without departing from the spirit thereof, and the invention includes all such modifications.

What is claimed is:

1. Apparatus for the continuous development of a diazotype material with a developer powder; comprising, closed hollow body means adapted to contain said developer powder, fine-meshed network means forming at least a portion of the walls of said hollow body and having openings whose cross-sectional areas are smaller than the cross-sectional areas of the smallest grains of said developer powder to thereby prevent said developer powder from passing through said network, transport means adapted to move said diazotype material relative to and in contact with the side of said network opposite said developer powder, and heating means following the hollow body with respect to the direction of travel of the diazotype material, whereby said diazotype material is passed by said heating means after contact with the network.

* * * * *